United States Patent
May et al.

(10) Patent No.: US 6,321,972 B1
(45) Date of Patent: Nov. 27, 2001

(54) APPARATUS AND METHOD FOR FILLING A BALL GRID ARRAY

(76) Inventors: John May, 520 W. Apex Ct., Tucson; Timothy J. Provencher, 1500 E. Pusch Wilderness Dr., #17204, Oro Valley, both of AZ (US) 85737

( * ) Notice: Subject to any disclaimer, the term of this patent is extended or adjusted under 35 U.S.C. 154(b) by 0 days.

(21) Appl. No.: 09/243,255

(22) Filed: Feb. 3, 1999

Related U.S. Application Data

(63) Continuation-in-part of application No. 09/169,851, filed on Oct. 9, 1998.

(51) Int. Cl.[7] .............................. B23K 1/00; B23K 35/14
(52) U.S. Cl. ............................................. 228/41; 228/246
(58) Field of Search ..................... 228/245, 180.22, 228/33, 44.7, 39, 41, 49.5, 246

(56) References Cited

U.S. PATENT DOCUMENTS

| | | | |
|---|---|---|---|
| 5,601,229 | * | 2/1997 | Kakazato et al. ............... 228/246 |
| 5,749,614 | * | 5/1998 | Reid et al. ....................... 294/64.1 |
| 5,762,258 | * | 6/1998 | Le Coz et al. ................... 228/56.3 |
| 5,768,775 | * | 6/1998 | Nakazato ............................ 29/843 |
| 5,816,482 | * | 10/1998 | Grabbe ............................ 228/212 |
| 5,836,520 | * | 11/1998 | Bhandarkar et al. .......... 239/553.5 |
| 5,844,316 | * | 12/1998 | Mallik et al. .................... 257/738 |
| 5,890,283 | * | 4/1999 | Sakemi et al. .................... 29/840 |
| 6,095,398 | * | 8/2000 | Takahashi et al. ................ 228/41 |

\* cited by examiner

Primary Examiner—Tom Dunn
Assistant Examiner—Kiley Stoner
(74) Attorney, Agent, or Firm—Stephen T. Sullivan

(57) ABSTRACT

An apparatus for placing solder balls in a pattern on a substrate is provided for, for example, to create a ball grid array. The apparatus comprises a template having a first plane, a second plane, and a plurality of holes. The holes pass substantially orthogonally through the first and second planes so that the template is permeable to a fluid between the first and second planes. The holes correspond in location to the pattern and each of the holes passes through the template along an axis. Each of the holes has a first end adjacent to the first plane with a first cross section substantially parallel to the first plane. The first cross section has a first characteristic dimension, for example, a diameter if the first cross section is circular. In addition each of the holes has a second end adjacent to the second plane with a second cross section substantially parallel to the second plane. The second cross section has a second characteristic dimension. The second characteristic dimension is smaller than the first characteristic dimension and smaller than the solder ball diameter so solder balls will not pass through the template. Each hole further includes a wall extending substantially continuously from the first end to the second end. Related methods are also disclosed.

4 Claims, 6 Drawing Sheets

APPARATUS AND METHOD FOR FILLING A BALL GRID ARRAY

This application is a continuation-in-part of application Ser. No. 09/169,851, filed on Oct. 9, 1998 and entitled "Apparatus and Method for Filling a Ball Grid Array."

BACKGROUND OF THE INVENTION

1. Field of the Invention

The present invention relates to apparatus and methods pertaining to ball grid array technology and, more specifically, to apparatus and methods for filling a ball grid array with solder balls.

2. Description of the Related Art

The electronics industry is one of the most dynamic and important industries today. It has literally transformed the world and provides many products that affect our daily lives, for example, telephones, television, personal computers, cellular phones, pagers, video camcorders, audiovisual products, etc. One of the key technologies that helps make these products possible is electronics packaging. This field of technology can be divided into a hierarchy of levels beginning with chip level packages and proceeding to multi-chip packages, printed circuit boards, mother boards, and component cases including boards, power supplies, etc.

A key area of development in the field of electronic packaging is the area of chip level packaging and interconnections. The most common types of chip level interconnections are wire bonding, tape-automated bonding (TAB), and solder bumping. Among these three technologies, solder bumped flip chip provides the highest level of packaging density with the least package space. The solder bumping is created by solder balls which are reflowed onto connection points or pads on the chip and/or the package. The solder balls are arranged in arrays on the chips and the packages. These arrays are known as ball grid arrays ("BGA").

Ball grid array packaging is rapidly emerging as the technology of choice for high input/output (I/O) count integrated circuits (IC's). Ball grid arrays deliver higher density and yields than traditional packages without requiring fine-pitch processing or new assembly equipment. Driven by the increasing I/O as IC's become larger and more complex, the demand for ball grid array packages is expected to grow from fewer than 20 million units in 1995 to more than 2 billion by 1999.

In BGA technology, the solder balls must be placed onto desired locations in an array on the substrate. "Substrate" as the term is used herein refers to the item upon which the solder balls are to be placed and bonded to form the ball grid array. Examples of such substrates include printed circuit boards, flux circuits, and ceramic panels. They may be housed in the form of individual chips or boards, or held in carriers such as boats or trays.

Each substrate typically includes a plurality of solder sites or pads positioned in an array corresponding to the desired pattern of bonding sites for the substrate. The solder pads typically comprise a metal pad, for example, measuring slightly smaller than the solder ball which is to be placed upon the solder pad.

The solder balls typically used in BGA technologies generally comprise eutectic solders such as tin-lead solders, solder coated copper, or high temperature alloys. Examples of tin-lead solder ball compositions are 63% tin—37% lead and 62% tin—36% lead—2% silver, typically for use with plastic ball grid arrays, and 10% tin—90% lead, typically for use with ceramic ball grid arrays, although other compositions are possible. The solder balls used in current applications typically have sizes ranging from as small as 5 mills (thousandths of an inch) to as large as 30 mills. Other sizes and size ranges have been used in the past and quite well may be used in the future. In a given application, a single size of solder ball is commonly used, although this is not necessarily true universally. As used herein, the term "solder ball" is used to refer to the generally spherical unit of bonding material used in the ball grid array to bond and electrically couple the solder pads or bonding sites on the substrate to an object to which the substrate is to be electrically coupled.

It is generally a necessity for high-quality ball grid array technology that the solder balls be accurately placed on the solder pads. In most applications, it is also a requirement that one and only one solder ball be placed on each solder pad. Moreover, this precision placement must be done in a way which preserves the phyiscal and geometric integrity of the solder ball. It is generally unacceptable, for example, for any deformation of the solder balls, slicing of the solder balls, etc. to occur. When a solder ball is cut in two during processing, for example, it is generally necessary to stop the process, inspect the solder ball reservoir for ball fragments, and to remove those ball fragments before processing can continue.

The placement of the individual solder balls onto a substrate in the ball grid array pattern traditionally has been done using a stencil or template. The template includes a number of holes positioned in a pattern corresponding to the solder pads on the substrate. Each hole is slightly large then the diameter of the solder balls, so that one solder ball easily slides or falls into each hole.

The substrate generally has been previously processed so that a flux has been applied to the solder pads. The flux interacts with the solder of the solder balls in known fashion to facilitate bonding, for example, to act as a pad cleaning and wetting agent.

The substrate and/or the template are moved relative to one another so that the substrate contacts the template, and the array of holes in the template are aligned with the solder pads on the substrate. Solder balls then are distributed so that one solder ball is placed into each of the holes. The solder balls thus rest upon and are in contact with the respective solder pads. The template then is removed, and the substrate, including the properly-positioned solder balls, are further processed, such as by placing them into a reflux oven to melt the solder balls and thereby bond the solder balls to the solder pads.

A number of methods and apparatus have been developed for distributing the solder balls into the holes of the template, and otherwise for the handling, control and placement of the solder balls. U.S. Pat. No. 5,499,487, issued to McGill on Mar. 19, 1996 and U.S. Pat. No. 5,551,216, issued to McGill on Sep. 3, 1996, provide examples. In these patents, a device is disclosed which comprises an apparatus for placing solder balls in a ball grid array. The apparatus includes a wheel having an inner and outer face, wherein the wheel is rotatable about a horizontal axis. The apparatus includes means for attaching a ball grid array to the inner face of the wheel, means for attaching a tooling fixture to the outer face of the wheel in position corresponding to that of said ball grid array, means for forming a reservoir of solder balls at the bottom of the wheel, and means for controllably rotating the wheel to move the tooling fixture through the reservoir in a manner to fill recesses in the fixture with solder balls and to remove from the surface of the array any excess solder balls which are not occupying recesses. The inner and outer faces are separated a distance to permit the tooling fixture to engage solder balls in the reservoir while the ball grid array does not engage the solder balls.

The solder balls on the ball grid array often are very closely spaced and the recesses into which they must be located are very small. Because of the high volume requirements and the highly competitive nature of the electronics industry, the placement of the solder balls on the ball grid arrays must be performed in a minimum amount of time, and for as little cost as is feasible. The handling, control and placement of the solder balls often is a critical portion of this operation.

Key factors in designing a solder ball placement apparatus and method include the speed at which the placement can be accomplished, the accuracy and yield of the process, the cost of the equipment to perform the process, the reliability of the equipment, etc. Considering the extremely small size of these solder balls, which can range in diameter down to 5 mils and potentially smaller, the high number of solder balls required for the ball grid arrays to interconnect today's high density chips, and the precision required in the placement of the solder balls, achieving high yields at high throughput rates has been difficult.

One limitation of known ball placement devices and methods has been that they do not always effectively place solder balls in all available template holes. Another limitation has been that such known devices and methods generally have relied on gravitation force to maintain positive control over the solder balls once they are in the template holes. Using such devices and methods, the balls may become dislodged or otherwise be removed from the holes. In some instances, for example, known techniques for cleaning the top surface of the template to remove excess solder balls has resulted in dislodging balls from inside the holes.

Another limitation of some known devices has been a difficulty in removing solder balls from the template holes to place them on the substrate. Solder balls sometimes became lodged in the holes and do not readily come out when desired.

OBJECTS OF THE INVENTION

Accordingly, an object of the present invention is to provide an apparatus and method for the placing solder balls in a ball grid array on a substrate wherein the placement of solder balls onto the substrate is performed accurately.

Another object of the present invention is to provide an apparatus and method for the placing solder balls in a ball grid array on a substrate wherein the placement of solder balls onto the substrate is performed quickly.

Another object of the present invention is to provide an apparatus and method for the placing solder balls in a ball grid array on a substrate wherein the placement of solder balls onto the substrate wherein the solder balls may be reliably onto the substrate.

Another object of the present invention is to provide an apparatus and method for the placing solder balls in a ball grid array on a substrate without requiring the use of gravity to provide for ball motion.

Additional objects and advantages of the invention will be set forth in the description which follows, and in part will be apparent from the description, or may be learned by practice of the invention. The objects and advantages of the invention may be realized and obtained by means of the instrumentalities and combinations pointed out in the appended claims.

SUMMARY OF THE INVENTION

To achieve the foregoing objects, and in accordance with the purposes of the invention as embodied and broadly described in this document, an apparatus is provided for placing solder balls in a pattern on a substrate, e.g., to form a BGA. For dimensional reference, each of the solder balls in a given application has a "solder ball diameter" equal to about the average diameter of the solder balls in the given application. The apparatus according to one aspect of the invention comprises a template having a first plane, a second plane, and a plurality of holes. The holes pass substantially orthogonally through the first and second planes so that the template is permeable to a fluid between the first and second planes. The holes correspond in location to the pattern and each of the holes passes through the template along an axis. Each of the holes has a first end adjacent to the first plane with a first cross section substantially parallel to the first plane. The first cross section has a first characteristic dimension. Characteristic dimension as used herein means to the diameter of the largest solder ball which will pass through a particular cross section, for example, the first cross section. If a cross section is circular in shape then its corresponding characteristic dimension is its diameter. Additionally, each hole has a second end adjacent to the second plane with a second cross section substantially parallel to the second plane. The second cross section has a second characteristic dimension. The second characteristic dimension is smaller than the first characteristic dimension and smaller than the solder ball diameter so solder balls will not pass through the template. Each hole further includes a wall extending substantially continuously from the first end to the second end. Continuous as used herein means that there are no abrupt changes in the direction of the wall which would form edges or corners with measurable angles as the wall extends from one end of the continuous section to the other, for example, from the first end to the second end of the hole.

The apparatus in accordance with this aspect of the invention preferably has a first and second cross sections that are substantially circular in shape. The hole is preferably substantially conical in shape. The axis includes an axial plane intersecting the wall along a substantially straight line. The line forms a cone angle with the axis which can be used to describe the cone's shape. The cone angle is preferably between about 15 and about 30 degrees.

Further in accordance with the preferred embodiment of this aspect of the invention the first characteristic dimension is larger than the solder ball diameter and more preferably, the first characteristic dimension is about 1.3 times the size of the solder ball diameter. The second characteristic dimension is preferably about 0.7 times the size of the solder ball diameter. The template has a thickness between and substantially orthogonal to the first and second planes. The thickness is preferably from about 0.8 to about 1.0 times the solder ball diameter. This combination of dimensions for the holes results in a hole shape which allows the solder balls to enter the first end of the holes easily and fit substantially completely in the holes, but the solder ball will no pass through the second end of the holes. Thus, the solder ball is readily trapped and held in place in the holes when the solder balls are forced into the holes, for example, by a fluid such as air flowing into the holes from the first end to the second end.

As an optional aspect of the invention in accordance with this embodiment, the template is for handling substrates which include at least one protrusion respectively in at least one protrusion location. The first plane includes at least one template cavity. The at least one template cavity corresponds in location to the at least one protrusion location. This template configuration allows the template to readily mate to substrates with protrusions, because the at least one template cavity receives the at least one protrusion when the first plane is adjacent to the substrate.

In the preferred embodiment of this aspect of the invention, the apparatus further includes a backing surface. The backing surface contacts selected portions of the second plane of the template defining a substantially sealed cavity between the second plane of the template and the backing surface. The backing surface includes ribs or walls which contact the second plane of the template. These ribs or walls add additional support to the template so the template keeps its intended shape, for example flat, when the template is in use. The position of these ribs or walls is preferably such that they do not interfere with or block the holes in the template, for example so that all the holes are in fluid communication with the cavity.

In another optional feature in accordance with this aspect of the invention the template comprises a metallic material and the apparatus further includes a magnet disposed opposite the template for magnetically attracting the second plane of the template toward the backing surface. This improves ease of removal and replacement of templates. In addition, this provides for improved support of the template during operation so as to preclude template distortion such as ballooning. This can otherwise occur when the cavity is pressurized to flow air to the template from the backing surface to force solder balls out of the holes onto the substrate.

In accordance with another aspect of the preferred embodiment, the apparatus further includes a fluid controller operatively coupled to, and in fluid communication with the cavity. The fluid controller is for selectively causing the fluid to pass through the holes in a first direction from the first plane to the second plane to force the solder balls into the holes. In the preferred embodiments the fluid comprises air.

In the preferred embodiment of this aspect of the invention the fluid controller has a flow director which selectively causes the fluid to pass through the holes in a second direction opposite the first direction to force the solder balls out of the holes at the first plane of the template. Alternatively, the fluid controller may provide for fluid flow in the second direction only, forcing solder balls out of the holes. In this configuration the method of forcing solder balls into the holes is other than using fluid flow, for example, gravity can be used to force the solder balls into the holes.

In accordance with a second aspect of the invention, each of the holes in the template further includes a first section adjacent to the first end with a first wall and a second section adjacent to the second end with a second wall. The first section and the second section meet at a planar intersection substantially parallel to the first and second planes. The first wall extends substantially continuously from the first end to the planar intersection in a manner similar to the manner in which the hole wall extends from the first end to the second end in accordance with the first aspect of the invention. The planar intersection has a third cross section with a third characteristic dimension. The third characteristic dimension is smaller than the first characteristic dimension and smaller than the solder ball diameter so solder balls will not pass into the second section, and the second section is in fluid communication with the first section and the second end.

Similar to the first aspect of the invention, the preferred hole geometry is circular and the first, second, and third cross sections are substantially circular in shape. The first section is preferably substantially conical in shape. An axial plane including the axis of each hole intersects the first wall along a substantially straight line. The line forms a cone angle with the axis which may be used to describe the cone's shape. Thus, the shape and geometry of the first section of the hole in accordance with this aspect of the invention is essentially the same as the shape and geometry of the entire hole in accordance with the first aspect of the invention. The first characteristic dimension is preferably about 1.3 times the solder ball diameter and the third characteristic dimension is preferably about 0.7 times the solder ball diameter. The cone angle is preferably between about 15 and about 30 degrees, similar to the preferred cone shape for the hole in accordance with the first aspect of the invention. In the preferred embodiment of this aspect of the invention the second and the third characteristic dimensions are substantially the same size and the second section is substantially cylindrical in shape.

The template in accordance with this second aspect of the invention is used in a manner similar to that of the template of the first aspect of the invention. All the optional features of the invention and preferred methods of placing solder balls on a substrate which were previously described for the first aspect of the invention may be used with this aspect of the invention.

In accordance with another aspect of the invention, a method is provided for placing solder balls in a pattern on a substrate. The method comprises a first step of providing an apparatus having a template which is the same as the template described in accordance with the first aspect of the invention. The apparatus further includes a backing surface contacting selected portions of the second plane of the template. The backing surface defines a substantially sealed cavity between the second plane of the template and the backing surface. The cavity is operatively coupled to and in fluid communication with a fluid controller. The fluid controller is for selectively causing the fluid to pass through the holes in a first direction to force the solder balls into the holes.

The method further includes a second step of distributing a plurality of solder balls over the first plane of the template and causing the fluid to pass through the holes in the first direction forcing the solder balls into the holes. A third step of placing the apparatus and the substrate adjacent to one another. A fourth step of causing the fluid to stop passing through the holes in the first direction so the solder balls are no longer forced into the holes and a fifth step of moving the apparatus and the substrate apart and so the solder balls remain on the substrate.

As an optional feature in accordance with this aspect of the invention, the first step of the method preferably includes providing the fluid controller to have a flow director. The flow director selectively causes the fluid to pass through the holes in a second direction opposite the first direction. The fourth step of the method preferably includes causing the fluid to flow in the second direction to force the solder balls out of the holes at the first plane of the template onto the substrate.

In accordance with another aspect of the invention, a method is provided for placing solder balls in a pattern on a substrate. The method is the same as the method described above, except the method uses the template described in the accordance with the second aspect of the invention.

BRIEF DESCRIPTION OF THE DRAWINGS

The accompanying drawings, which are incorporated in and constitute a part of the specification, illustrate presently preferred embodiments and methods of the invention and, together with the general description given above and the detailed description of the preferred embodiments and methods given below, serve to explain the principles of the invention.

DETAILED DESCRIPTION OF THE PREFERRED EMBODIMENTS AND METHODS

Figure 1:
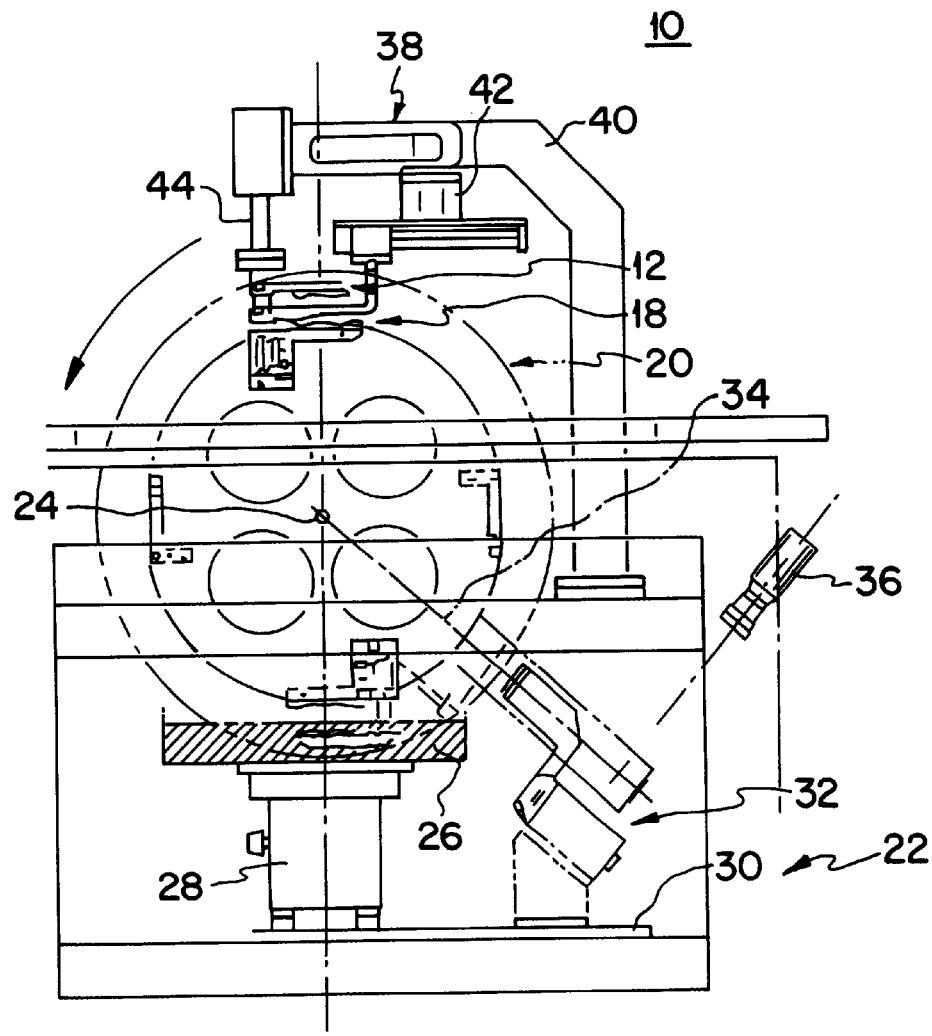
FIG. 1 is a front view of ball grid array fabrication machine for use in accordance with an apparatus according to a first preferred embodiment of the invention.

Reference will now be made in detail to the presently preferred embodiments and methods of the invention as illustrated in the accompanying drawings, in which like reference characters designate like or corresponding parts throughout the drawings. It should be noted, however, that the invention in its broader aspects is not limited to the specific details, representative devices and methods, and illustrative examples shown and described in this section in connection with the preferred embodiment and method. The invention according to its various aspects is particularly pointed out and distinctly claimed in the attached claims read in view of this specification, and appropriate equivalents.

In accordance with one aspect of the invention, an apparatus is provided for placing solder balls in a pattern on a substrate. Each of the solder balls has a solder ball diameter, which may be used as a reference in defining or describing distances and other relationships, as described above.

A ball grid array processing machine 10 for use in connection with a first preferred embodiment of the invention is shown in FIG. 1. Machine 10 includes an apparatus 12 for placing solder balls 14 (FIG. 3) on substrates 16' (FIG. 6) to create ball grid arrays. A tooling fixture 18 holds substrate 16 in place. Apparatus 12 and fixture 18 are mounted on a frame 20 as depicted in FIG. 1. Frame 20 is further mounted to the machine chassis 22 at a central axis 24 (shown for reference). A reservoir 26 retains solder balls to be placed on substrate 16. Reservoir 26 is mounted on a table 28 which is also mounted to chassis 22 through a support plate 30. An engagement mechanism 32 is mounted along a radius 34 (shown for reference). Engagement mechanism 32 is for moving fixture 18 to a position where substrate 16 is in contact with apparatus 12. A vision system 36 may be included to monitor the position of engagement mechanism 32.

Machine 10 further includes a positioning arrangement 38 mounted to chassis 22 by a support 40. Positioning arrangement 38 is for loading and unloading substrate 16 to and from fixture 18 and locating it relative to apparatus 12. Frame 20 rotates about axis 24 in a manner to allow apparatus 12 and fixture 18 to be moved from reservoir 26 to positioning arrangement 38. Positioning arrangement 38 includes a loading arm 42 for loading and unloading substrate 16 to and from machine 10. Positioning arrangement 38 further includes a positioning arm 44 for positioning of fixture 18 relative to apparatus 12. Machine 10 operates as generally described in U.S. Pat. No. 5,499,487 except as otherwise disclosed herein.

In accordance with this aspect of the invention, the apparatus includes a template having a first plane, a second plane, and a plurality of holes passing substantially orthogonally through the first and second planes so that the template is permeable to a fluid between the first and second planes. The holes correspond in location to the pattern and each of the holes passes through the template along an axis.

Figure 2:
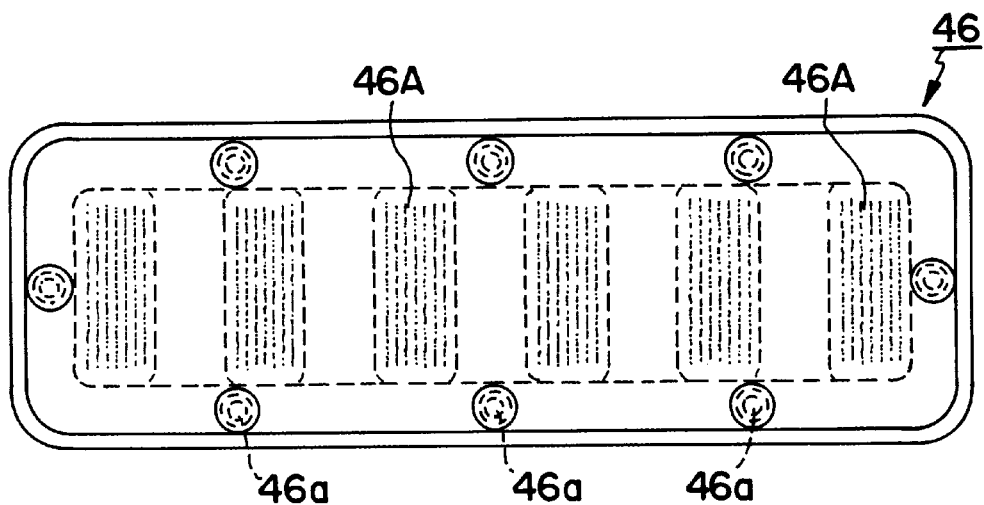
FIG. 2 is a top view of a template for use in connection with the apparatus shown in FIG. 1.
Figure 3:
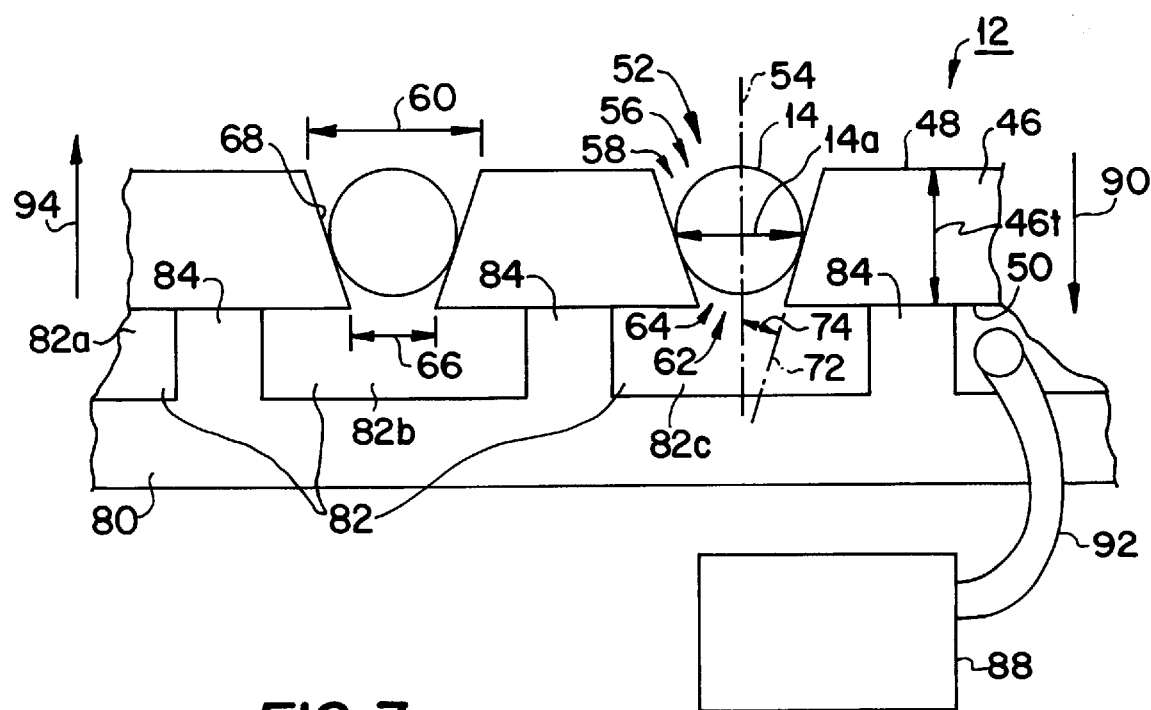
FIG. 3 is a side cutaway view of an apparatus for placing solder balls on a substrate to form a ball grid array in accordance with the first preferred embodiment of the invention.

In accordance with the preferred embodiment of the invention, apparatus 12 includes a template 46 for positioning solder balls 14 according to a pattern 46A corresponding to the desired BGA pattern and spacing as shown in FIGS. 2 and 3. Template 46 preferably will correspond to the individual characteristics, such as size, shape and pattern, for the substrate 16 being processed. Because a given machine typically is adapted to process many different types and sizes of substrate 16, the template used will vary from one application to the next. Therefore, other templates besides the one shown and described herein may be used, as will be understood by persons of ordinary skill in the art. The solder balls used in such applications also may vary in size from one application to another, although they typically will have a single diameter for a given application. The "solder ball diameter" as used herein refers to a representative or average solder ball diameter for the given application. The solder ball diameter as referred to herein is designated by reference numeral 14a. Template 46 preferably includes mounting holes 46a for mounting the template to ancillary equipment as will be described later. The mounting holes 46a are used in conjunction with fasteners such as screws or bolts to allow for the quick installation and removal of the template 46.

Template 46 has a first plane 48, and a second plane 50, which in this instance are parallel to one another as shown in FIG. 3. Template 46 may be made from a variety of materials, provided the template 46 has adequate structural rigidity, sufficient precision of hole placement in the ball array, adequate electrostatic properties, and provides for an adequate template life. The preferred materials are metals, such as stainless steel.

Template 46 includes a plurality of holes 52 passing substantially orthogonally through first and second planes 48 and 50 so that the template is permeable to a fluid between the first and second planes. The fluid is preferably a gas and more preferably air so that the solder balls 14 can be drawn into and pushed out of the holes by selectively directing the fluid to flow into or out of the holes 52 as described in more detail later. Each of the holes 52 passes through the template 46 along an axis 54 and corresponds in location to the pattern 46A of the BGA. Holes 52 preferably are disposed so that their longitudinal axes are orthogonal (90 degrees) with respect to the first and second planes 48 and 50. Each hole 52 in this embodiment thus is parallel to the axis 54 of each respective hole. As noted, holes 52 are arranged in a pattern to match the pattern of the ball grid array for which they are intended to populate with solder balls 14.

Further in accordance with this aspect of the invention, each of the holes has a first end adjacent to the first plane with a first cross section substantially parallel to the first plane, the first cross section having a first characteristic dimension, and a second end adjacent to the second plane with a second cross section substantially parallel to the second plane. The second cross section has a second characteristic dimension smaller than the first characteristic dimension and smaller than the solder ball diameter so solder balls will not pass through the template.

In accordance with the preferred embodiment of this aspect of the invention, each of the holes has a first end 56 adjacent to the first plane with a first cross section 58 substantially parallel to the first plane 48 as shown in FIG. 3. The first end 56 is for receiving the solder balls 14 into the holes 52 as described later. The first cross section 58 may be any shape that will accept the solder balls. The first cross section has a first characteristic dimension 60 which corresponds to the diameter of the largest sphere which will pass through the first cross section. In the preferred embodiments the first cross section 58 is substantially circular in shape and the first characteristic dimension 60 corresponds to the diameter of the circle. In the case where the first cross section 58 is not circular in shape, the first characteristic dimension 60 corresponds to the diameter of the largest circle which can fit in its entirety through the first cross section.

In the preferred embodiment, the first characteristic dimension 60 is larger than the solder ball diameter 14a so the solder ball 14 will fit through the first end 56. The first characteristic dimension 60 is preferably sized to be about 1.3 times the diameter of the solder ball. This sizing allows for easy entry and exit of solder balls 14 to and from the holes 52 as will be described in more detail later.

In the preferred embodiment each of the holes has a second end 62 adjacent to the second plane with a second cross section 64 substantially parallel to the second plane 50. The second end 62 is opposite the first end 56 and is in fluid communication with the first end so that fluid can pass between the first and the second planes 48 and 50 as described earlier. The second cross section 64 has a second characteristic dimension 66 corresponding to the diameter of the largest sphere which will pass through the second cross section, much as was described for the first characteristic dimension 60 previously. In the preferred embodiments the second cross section 64 is substantially circular in shape and the second characteristic dimension 66 corresponds to the diameter of the circle. The second characteristic dimension 66 is smaller than the first characteristic dimension 60 and smaller than the solder ball diameter 14a so solder balls 14 will not pass through the template 46. Thus, the sizing of the first and second characteristic dimensions 60 and 66 are such that solder balls 14 may enter the holes 52 through the first end 56, but they will not exit the holes through the second end 62. In this manner, when a force is applied to the solder balls 14 from the first end 56 to the second end 62 such as, for example, by a fluid, the solder balls are forced into the holes 52 where they are captured. In the preferred embodiment the second characteristic dimension 66 is about 0.7 times the solder ball diameter 14a. This is sufficiently small that even with the typical size distribution and variation that is present in production solder ball lots, none of the solder balls will pass through the second end 62. This size also assures for the optimum hole geometry to allow the solder ball to enter into and generally fit in its entirety in the hole when it is forced into the hole as will be described in more detail later.

Further in accordance with this aspect of the invention, each of the holes has a wall extending substantially continuously from the first end to the second end.

Figure 4:
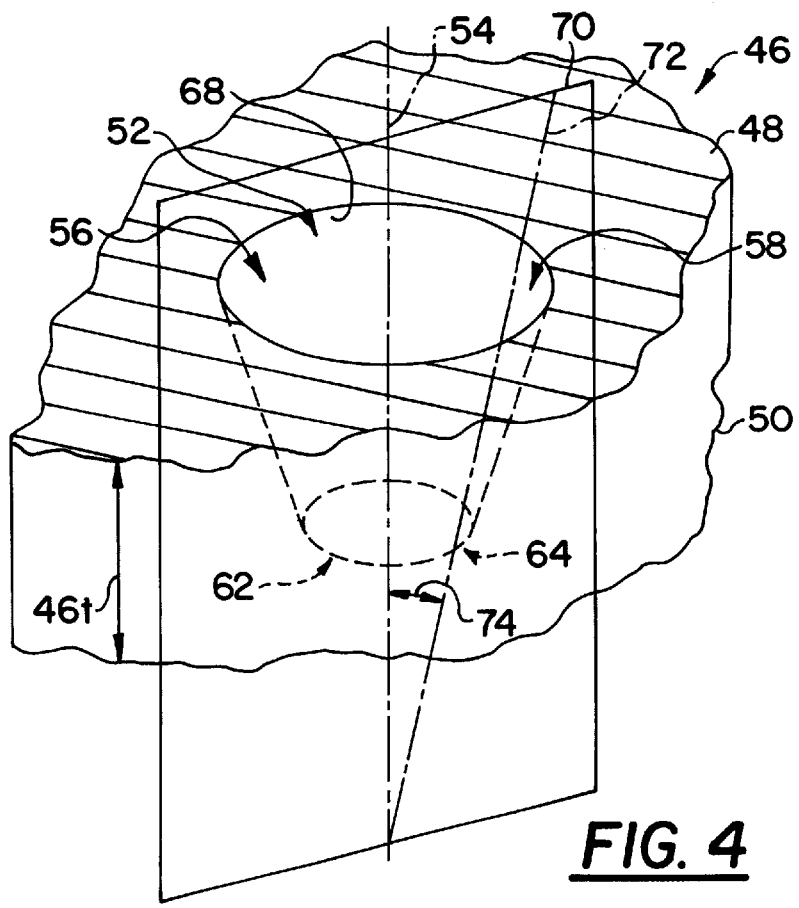
FIG. 4 is a perspective cutaway view of one of the holes in the template in accordance with the first preferred embodiment of the invention.
Figure 5:
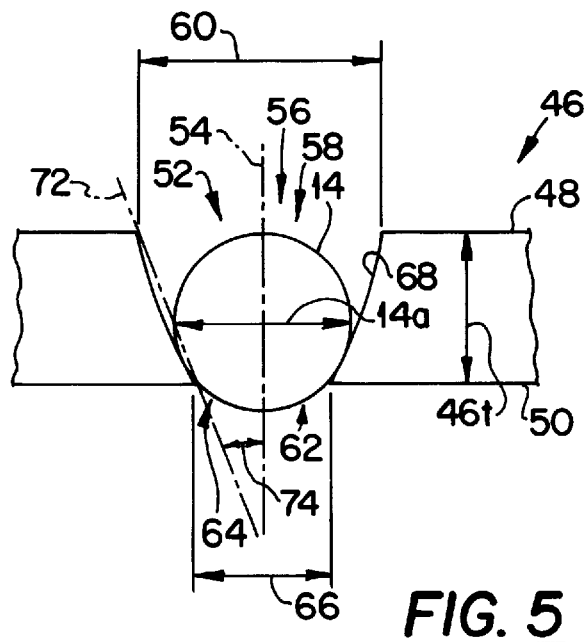
FIG. 5 is a side cutaway view of one of the holes in the first preferred embodiment of the template with concave curvature to the wall of the hole.

In accordance with this aspect of the invention, each of the holes has a wall 68 extending substantially continuously from the first end 56 to the second end 62 of the holes 52. As described earlier, in the first preferred embodiment the first and second cross sections 58 and 64 are substantially circular in shape. The wall 68 extends in a substantially continuous manner from the first end 56 to the second end 62 so that the hole 52 is substantially conical in shape as shown in FIG. 4. The wall 68 extends from the first end 56 to the second end 62 without any abrupt changes in direction which would form edges or corners with measurable angles, thus, the wall 68 is substantially continuous. The wall 68 is preferably somewhat rough or imperfect so that the hole 52 is not completely sealed to fluid flow when the solder ball 14 is in the hole 52. This improves the retaining of the solder ball in the hole as will be described in more detail later. The axis 54 is included by an axial plane 70. The axial plane 70 intersects the wall 68 along a line 72 which is substantially straight as shown in FIG. 4. The line 72 forms a cone angle 74 with the axis 54 which is preferably between about 15 and about 30 degrees. Optionally, the wall 68 may have a curvature to it as it extends from the first end 56 to the second end 62 of the hole 52. The curvature could be either convex or in preferably concave. In the preferred embodiments the holes are formed by either laser cutting or by chemical etching. Both of these techniques form a natural conical shape which and can be tailored by the process parameters to have the desired cone angle 74 of about 15 to about 30 degrees. Both of these forming techniques create a slight concave curvature to the wall 68 as depicted in FIG. 5. In this case, where the wall 68 is not completely straight, the line 72 is drawn from the circumference of the first end 56 to the circumference of the second end 62 and the cone angle 74 is measured between the line 72 and the axis 54. Other methods of forming the holes 52 may be used as well, such as drilling, electro-discharge machining, punching, milling, and the like, but the preferred methods are electro-chemical etching and laser machining.

As described previously, the first characteristic dimension 60, which in the case of the preferred embodiment is a first diameter, is larger than solder ball diameter 14a, so that the balls can easily fall or otherwise work themselves into the holes 52. The conical shape of the holes 52, however, assures that there is not undue movement of the solder balls 14 in the hole when the solder balls are forced into the hole. Currently-used solder balls typically have solder ball diameters of about 5 mils (thousandths of an inch), 12 mils, and 30 mils, although other sizes and other ranges have been and/or could be used. Each hole preferably is designed to have a depth such that, when the solder ball is retained in the hole, the top of solder ball is roughly flush with the outer surface of the template. Depending upon the exact geometry of the hole 52, the solder ball 14 will typically protrude from the second end 62 of the template 46 when the solder ball is forced into the hole. These factors result in an preferred hole depth of about 0.8 to about 1.0 solder ball diameters 14a. The template 46 has a thickness 46t between and orthogonal to the first and second planes 48 and 50 as depicted in FIG. 3. Since the hole depth is equal to the template thickness 46t in this embodiment, the preferred template thickness 46t is also about 0.8 to 1.0 times the solder ball diameter 14a.

In some applications, the substrate includes at least one protrusion having at least one corresponding protrusion location. Examples would include devices or assemblies in which a chip or similar element is located on the surface of the substrate upon which solder lands are located. This is sometimes referred to in the integrated circuit field as a "cavity down" device. This design creates problems for the application of solder balls using a template or like device, for example, because the protrusion impacts and interferes with the substantially flat, continuous surface of the template.

In accordance with another aspect of this invention, an apparatus is provided for the application of solder balls to a substrate of this type, i.e., one which includes at least one protrusion. The apparatus may comprise a template as heretofore described, such as template 46, wherein the first plane includes at least one template cavity corresponding in location to the at least one protrusion location. The at least one cavity of the first plane receives the at least one protrusion when the first plane of the template is adjacent to the substrate.

Figure 6:
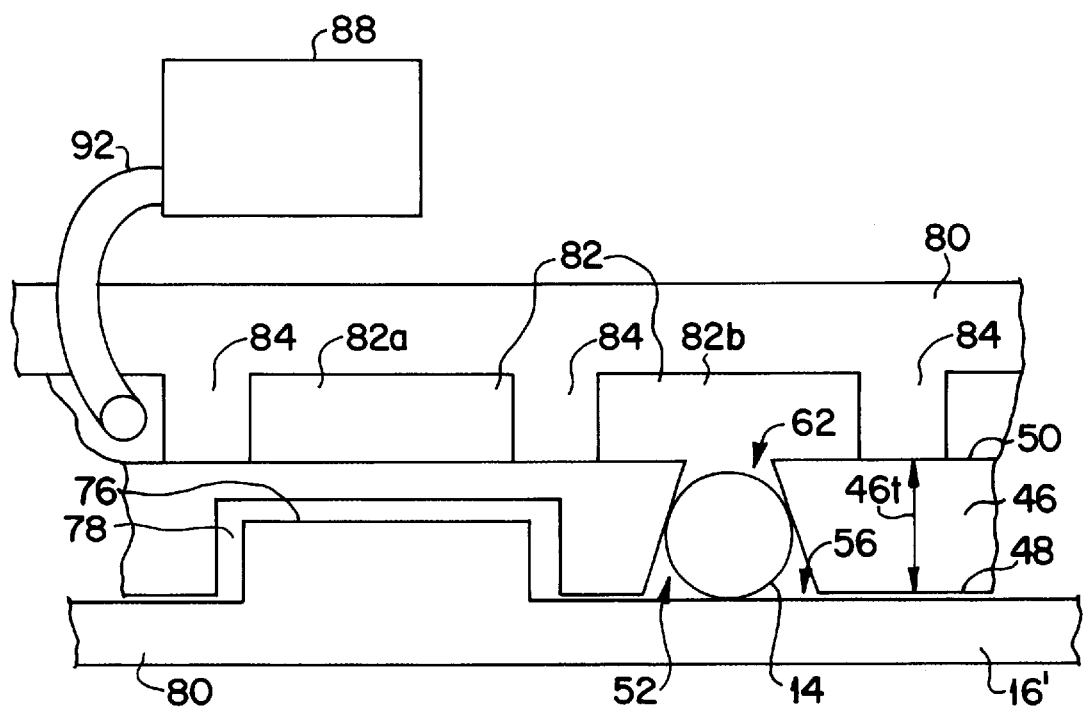
FIG. 6 is a side cutaway view of a substrate with a cavity and the template with a template cavity in accordance with an optional aspect of the first preferred embodiment.

As implemented in the first preferred embodiment, and to illustrate the principle, with reference to FIG. 6, substrate 16' includes a protrusion 76, such as a semiconductor chip, and template 46 includes a template cavity 78 in its first plane 48 corresponding in location to the location of protrusion 76. Template cavity 78 receives protrusion 76 when the first plane 48 of the template 46 is adjacent to the substrate 16'.

Apparatus 12 according to this embodiment further includes a backing surface 80 which contacts selected portions of the second plane 50 of the template 46. Backing surface 80, together with the second plane 50, define a substantially sealed cavity 82 between the second plane and the backing surface. Cavity 82 is open to and in fluid communication with the second end 62 of the holes 52.

Figure 7A:
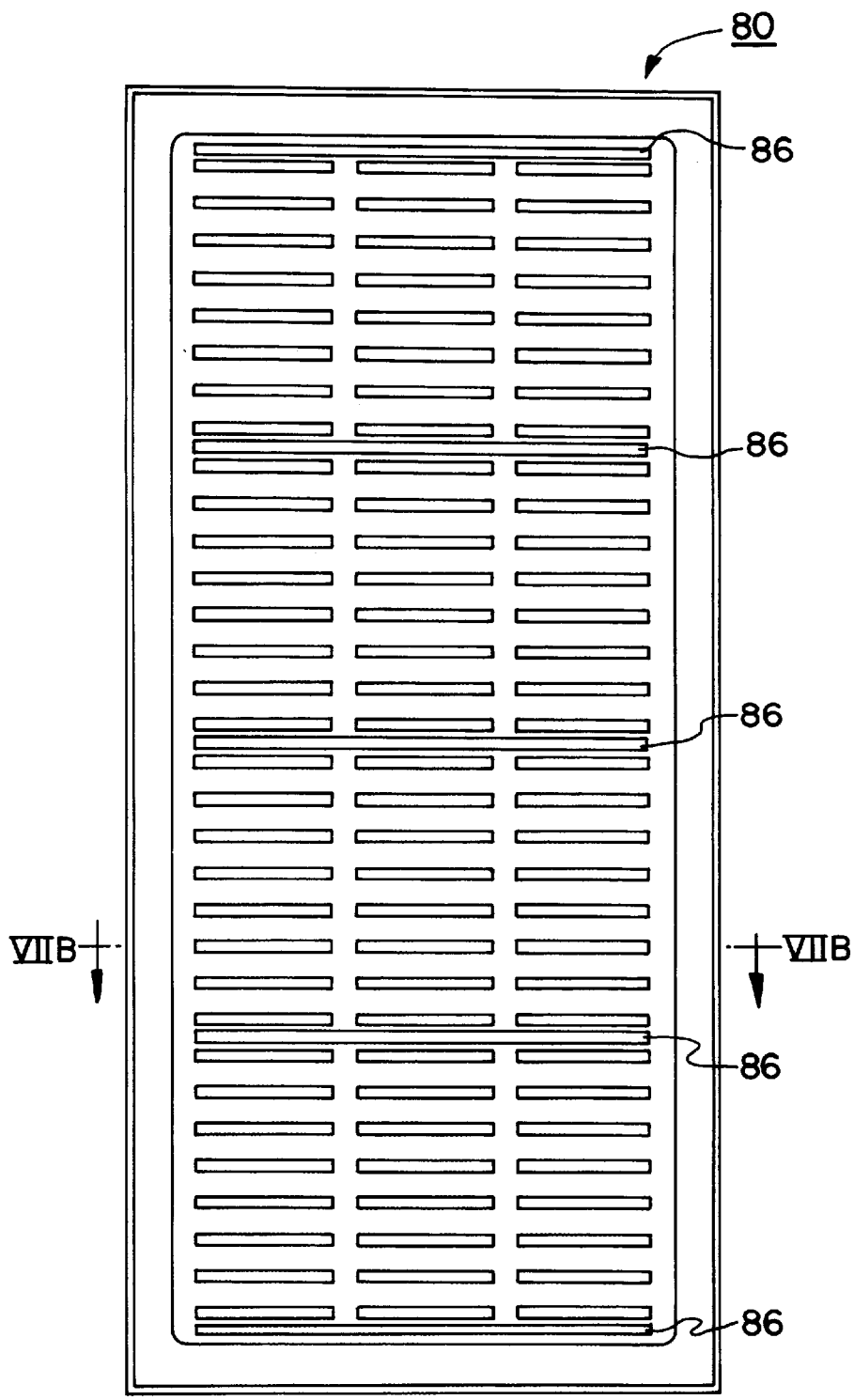
FIG. 7A is a top view and FIG. 7B a side view of the backing plate according to the preferred embodiments of the invention.
Figure 7B:
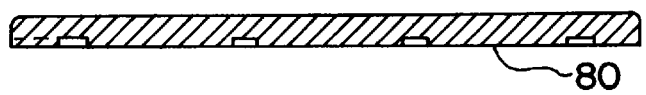

Cavity 82 may comprise a single chamber in which a fluid, in this case air, is held or through which it passes. This is not, however, limiting. Alternatively, for example, and preferably, the cavity comprises a plurality of individual chambers 82a, 82b, . . . each of which is associated with a region of the template or a subset of the holes 52. As shown in FIG. 7, for example, the backing surface 80 may comprise a manifold which includes a plurality of ribs or walls 84. In conjunction with the second plane 50 of the template 46, these ribs or walls define a plurality of chambers 82a, 82b, . . . between the backing surface 80 and the second plane 50. These ribs 84 preferably do not block off any of the holes 52 in the template 46, so all of the holes are in fluid communication with the cavity 82 formed between the backing surface 80 and the template 46.

As an optional aspect of the apparatus of this first preferred embodiment, apparatus 12 may be adapted to include a template comprised of a magnetic material, and a magnet 86 disposed opposite the template 46 on the backing surface 80 for magnetically attracting the second plane 50 of the template toward the backing surface. This aids in maintaining intimate contact between the second plane of the template and the backing surface. A plurality of magnets 86 preferably are positioned within various ones of the chambers 82a, 82b, . . . formed by walls in backing surface 50.

The attachment of the template 46 to the backing surface 80 may be accomplished by any of the common means of removable attachment such as screws, bolts, magnetic attachment with pin alignment, etc. Preferred methods of attachment include screws, screws with magnetic attachment, and magnetic attachment with alignment pins. It is desirable for the template to be easily removed from the backing surface for replacement because the templates need to be changed as the ball grid array pattern of the substrate 16 receiving the solder balls 14 is changed. The magnetic attachment allows for very quick removal and replacement of the template 46, but provides a sufficiently strong means of attachment to prevent ballooning of the template when the differential air pressure between the cavity 82 and the atmosphere is positive as described in more detail later. This can occur when the balls are being released from the template. A combination of screws or other forms of quick release fasteners with magnetic attachment provides for an optimum combination of ease of replacement and strength of attachment.

As implemented in the first preferred embodiment, apparatus 12 includes a fluid controller 88 in fluid communication with the cavity 82 for selectively causing the fluid, i.e., air, to pass through the holes 52 in a first direction 90 to force solder balls 14 into the holes. Fluid controller 88 in this embodiment is operatively coupled to the backing surface 80, so that it is operatively coupled to and in fluid communication with the cavity chambers 82a, 82b, . . .

The fluid controller 88 in this preferred embodiment comprises a pneumatic system which includes a source of pneumatic flow, bi-directionally. Examples of such a system would include, for example, an air pump, compressed air tank, a vacuum pump, or a vacuum reservoir. The fluid controller 88 includes associated piping and valving 92 so that, under the control of an operator or automated control device, the fluid controller can regulate the flow of air through the cavity 82, including the chambers 82a, 82b, . . . , and thus through the holes 52. The apparatus further includes a flow director so that the operator or control system can change the direction of the fluid flow. Thus, the regulated flow can be directed in the first direction 90, so that air flows into the holes 52, i.e. from the first plane 48 of the template 46 to its second plane 50, or in a second direction 94 substantially opposite the first direction 90, i.e. out of the holes, from the second plane of the template to its first plane. This air flow makes corresponding changes in the pressure at the interface between the second plane 50 and the first plane 48, so that the solder balls 14 are forced into the holes 52 during a negative pressure (vacuum) cycle, for example, as balls are being loaded into the template 46 and moved to the substrate 16, or out of the holes during a positive pressure cycle, for example, as balls are being mounted onto a substrate. Forcing the solder balls 14 into the holes 52, as referred to herein, includes securely holding or retaining the balls in place in the holes after they have been seated in the holes.

As discussed earlier, in the preferred embodiment the wall 68 of the holes 52 is not entirely smooth. This allows air flow to continue while solder balls 14 are being held in the holes during a negative or vacuum pressure cycle. This way the solder ball is typically supported by the walls at only three places, thus minimizing solder ball contact with the wall. This minimizes or eliminates the possibility of a solder ball sticking in the hole when the vacuum is removed from the chamber 82, helping to assure the solder balls will be placed on the substrate as intended. Another advantage of this hole geometry is that, when the solder ball is forced into the hole, it contacts the wall at these three points and is held there, thus preventing excess kinetic energy from causing the ball to roll around in the hole, as is the case in other BGA apparatus designs with cylindrical holes.

Because in practice this process typically would be automated, the fluid controller 88 also may include a process controller, such as programmable logic controller, for automatically controlling the actuation of the valving 92 to control the flow of air, for example, from the negative pressure cycle to a positive pressure cycle as described above, and so on.

In accordance with another aspect of this invention, each of the holes may include a first section adjacent to the first end with a first wall and a second section adjacent to the second end with a second wall. The first section and the second section of each hole meet at a planar intersection substantially parallel to the first and second planes of the template. The first wall extends substantially continuously from the first end to the planar intersection. The planar intersection has a third cross section with a third characteristic dimension smaller than the first characteristic dimension and smaller than the solder ball diameter so solder balls will not pass into the second section of the holes. The second section of the holes is in fluid communication with the first section and the second end so the template is permeable to a fluid from the first side to the second side in a manner essentially the same as described above for the first preferred embodiment.

Figure 8:
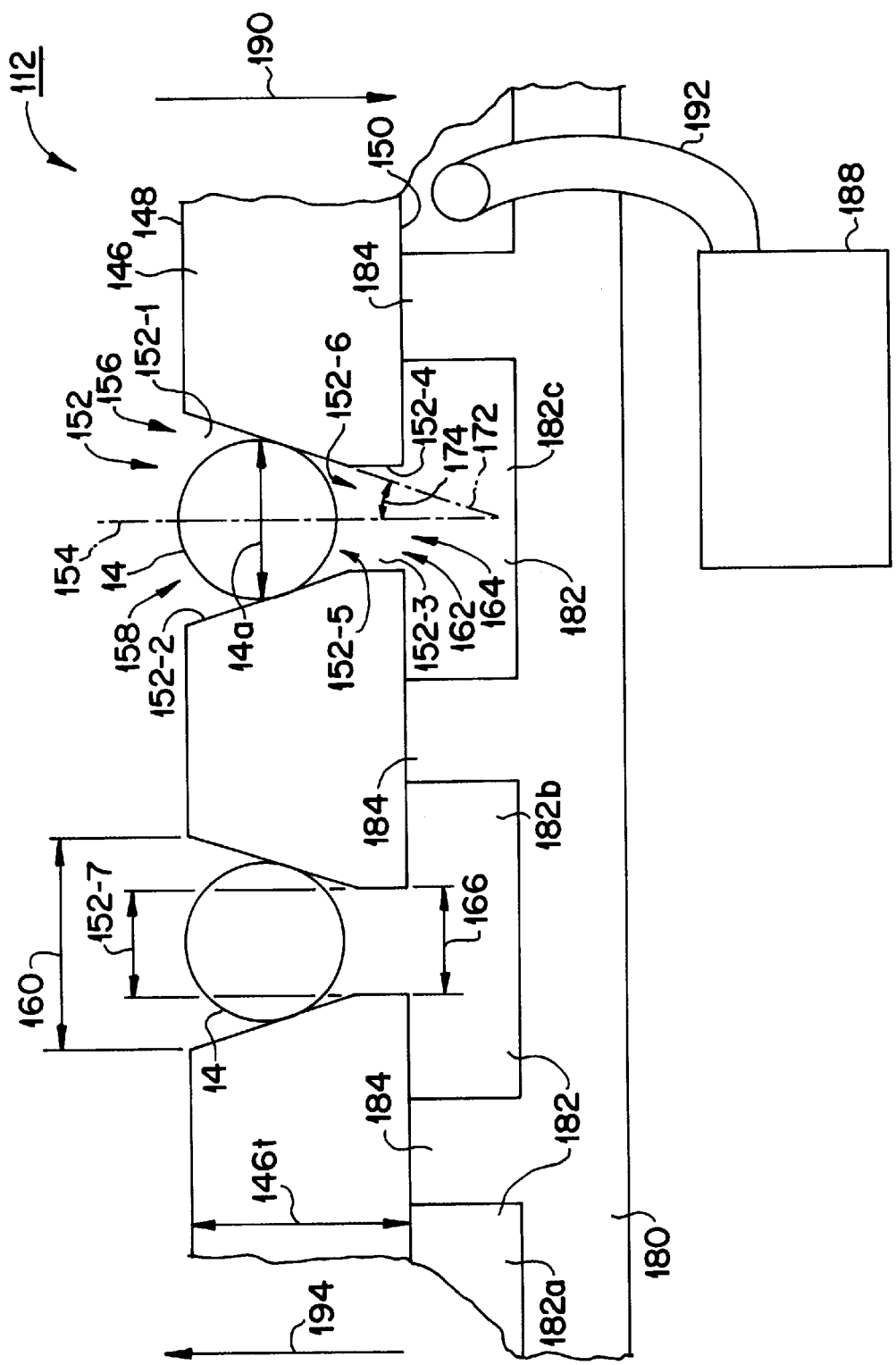
FIG. 8 is a side cutaway view of an apparatus for placing solder balls in a ball grid array on a substrate, in accordance with a second preferred embodiment of the invention.

An apparatus 112 according to a second preferred embodiment of the invention which incorporates these features is illustrated in a side cutaway view in FIG. 8. As in the first preferred embodiment, apparatus 112 includes a template 146 and a backing surface 180, essentially as described above. In this embodiment, however, the holes 152 in the template 146 differ from those of the first preferred embodiment in the following respects. In template 146 of this embodiment, each of the holes 152 includes a first section 152-1 adjacent to the first end 156 of each hole. Each first section 152-1 has a first wall 152-2. In addition, each hole 152 includes a second section 152-3 adjacent to the second end 162 of each hole. Each second section has a second wall 152-4. In each hole 152, the first section 152-1 and the second section 152-3 meet at a planar intersection 152-5 which is substantially parallel to the first plane 148 and the second plane 150 of template 146. The first wall 152-2 extends substantially continuously from the first end 156 to the planar intersection 152-5 in a manner essentially the same as the manner wall 68 extends substantially continuously from first end 56 to second end 62, as described above for the first preferred embodiment. Thus, first section 152-1 is in this second preferred embodiment is essentially the same in configuration and geometry as hole 52 in the first preferred embodiment. Planar intersection 152-5 has a third cross section 152-6 with a third characteristic dimension 152-7 which is smaller than the first characteristic dimension 160 and smaller than the solder ball diameter 14a so solder balls 14 will not pass into the second section 152-3 of the holes 152. The third characteristic dimension 152-7 is the diameter of the largest solder ball which will pass through the third cross section 152-6, similar to the description provided previously for the first and second characteristic dimensions 60 and 66.

In apparatus 112, the second section 152-3 extends hole 152 so the template 146 may be thicker than would otherwise be practical for the first preferred embodiment which does not have the second section. This may be advantageous when additional template thickness is required as, for example, if additional structural integrity is required for the template as might be the case with very small solder balls or if the substrate has a large protrusion which requires a cavity in the template which would otherwise be deeper than the thickness of the template. Each second section 152-3 can be of any shape and geometry which provides adequate fluid communication to the first section 152-1, but in the preferred embodiment the second and the third characteristic dimensions 166 and 152-7 respectively are substantially the same size and the second section 152-3 is substantially cylindrical in shape. The first and second sections 152-1 and 152-3 may be formed by any of the same methods as previously described for the first preferred embodiment, but the preferred methods are chemical etching and laser machining.

Template 146 of this second preferred embodiment is used in a manner similar to template 46, and all the optional features of apparatus 12 and preferred methods of handling solder balls with apparatus 12 apply to apparatus 112. For example, first and second sections 152-1 and 152-3 of holes 152 are in fluid communication, so that air passes through both sections into or out of cavity 182 and its chambers 182a, 182b, . . . For example, apparatus 112 preferably includes a fluid controller 188 in fluid communication with the cavity 182 for selectively causing a fluid, such as air, to pass through the holes 152 in a first direction 190 to force solder balls 14 into the holes. Fluid controller 188 in this embodiment is operatively coupled to the backing surface 180, so that it is operatively coupled to and in fluid communication with the cavity chambers 182a, 182b, . . . Fluid controller 188 may comprises a pneumatic system including a source of pneumatic flow, bi-directionally as described previously for the first preferred embodiment. The apparatus 112 may further includes a flow director so that the operator or control system can change the direction of the fluid flow. Thus, the regulated flow can be directed in the first direction 190, so that air flows into the holes 152, i.e. from the first plane 148 of the template 146 to its second plane 150, or in a second direction 194 substantially opposite the first direction 190, i.e. out of the holes 152, from the second plane of the template 146 to its first plane. Reference numbers 146t, 154 158, 164, 172, 174, 184, and 192 of FIG. 8 correspond respectively to reference numerals 46t, 54, 58, 64, 72, 74, 84, and 92 shown respectively in FIGS. 3 and 4, and therefore have been described in detail here to avoid duplication.

Figure 9:
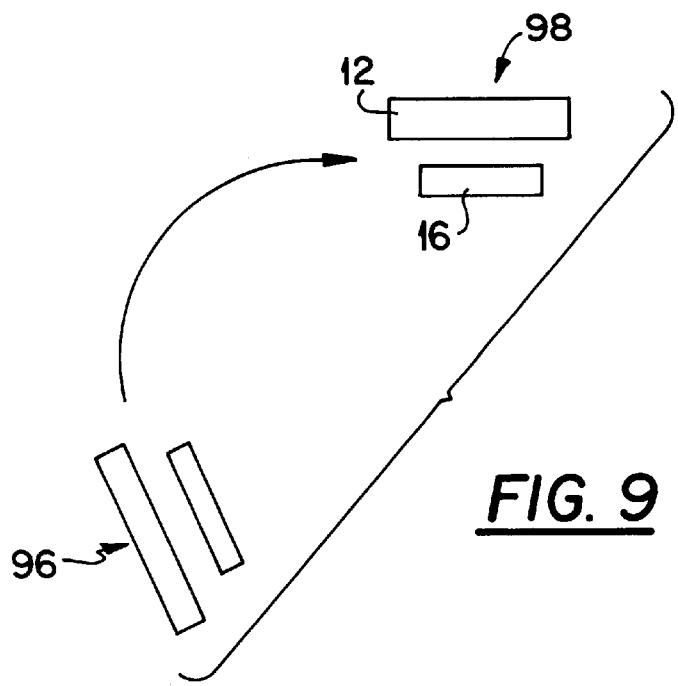
FIG. 9 is a diagram which illustrates an alternative embodiment of the machine in which the apparatus according to the preferred embodiments of the invention may be used.

The apparatus according to either the first or the second embodiment may be advantageously implemented in a machine as depicted in FIG. 1. Other embodiments and arrangements, however, could be used advantageously with the apparatus described herein. FIG. 9, for example, shows apparatus 12 or 112 in a configuration in which the apparatus is loaded with solder balls 14 at a location 96 corresponding to about 200 to 210 degrees from the positive x axis in a machine essentially as shown in FIG. 1. Apparatus 12 or 112 is loaded with balls, for example, by distributing balls over first plane 48 or 148 of template 46 or 146, e.g., in known fashion such as is generally described in U.S. Pat. No. 5,499,487, and as is commercially known in other examples. During this loading or filling process, fluid controller 88 or 188 applies negative pressure, or vacuum, so that solder balls 14 are pulled into holes 52 or 152 as they enter the perimeter of those holes, and the solder balls are securely retained in the holes once they fall into them.

Once the template 46 or 146 is fully populated with balls at this location, the substrate 16 is moved to contact the template. At this stage, the combined apparatus and contacting substrate 16 are moved to a top dead center or 90-degree location 98. At location 98, fluid controller 88 or 188 reverses air flow so that air flows out of holes 52 or 152, and the balls 14 are thus pushed from the holes and onto substrate 16.

Figure 10:
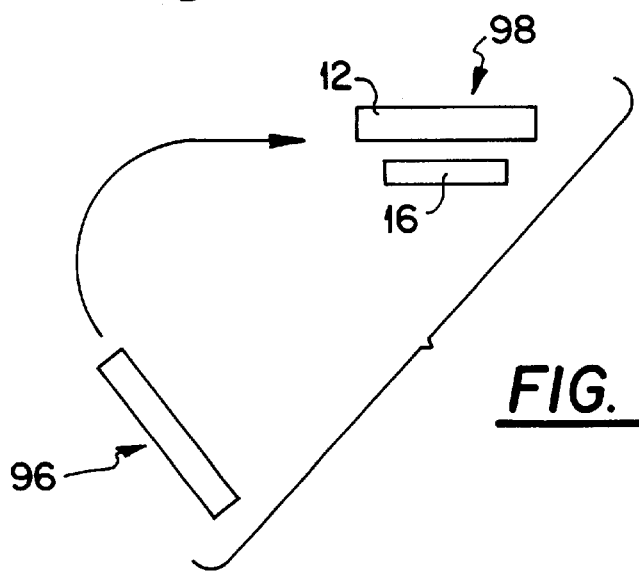
FIG. 10 is a diagram which illustrates another alternative embodiment of the machine in which the apparatus according to the preferred embodiments of the invention may be used.

A second optional implementation of the apparatus of the first and second embodiment is illustrated in FIG. 10. In this embodiment, apparatus 12 or 112 initially is located at position 96, where template 46 or 146 is filled with solder balls 14 as described above. Fluid controller 88 or 188 applies a vacuum so that the balls 14 are retained in holes 52 or 152. Apparatus 12 or 112 then is moved to location 98, where substrate 16 is moved to apparatus 12 or 112 and contacts the first plane 48. Fluid controller 88 or 188 then reverses air flow so that positive pressure is applied to cavity 82 or 182 and air flows out of holes 52 or 152. This forces balls 14 out of holes 52 or 152, and onto substrate 16.

Figure 11:
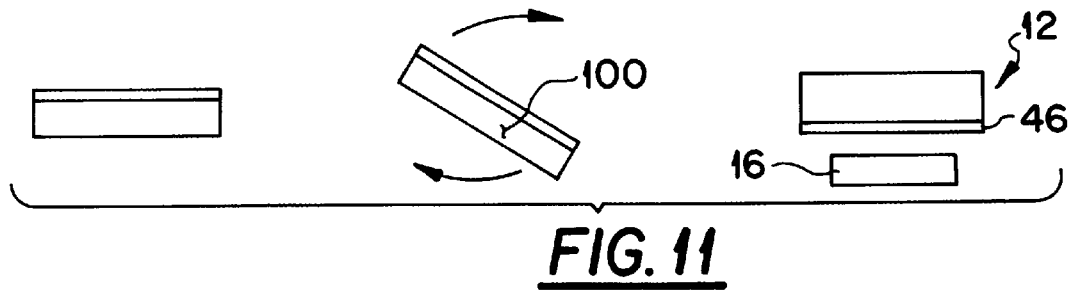
FIG. 11 is a diagram which illustrates yet another alternative embodiment of the machine in which the apparatus according to the preferred embodiments of the invention may be used.

Another optional implementation of the apparatus of the first and second embodiment is illustrated in FIG. 11. In this embodiment, apparatus 12 or 112 rotates about an axis 100. More specifically, apparatus 12 or 112 is initially disposed so that first plane 48 or 148 of template 46 or 146 is disposed upwardly as shown in the drawing figure. At this location, solder balls 14 are distributed over template 46 or 146 as generally described above to populate all of the holes 52 or 152. Fluid controller 88 or 188 applies a vacuum during this process, as described above.

Once template 46 or 146 is fully populated, apparatus 12 or 112 rotates about axis 100 by 180 degrees so that first plane 48 and 148 of template 46 or 146 is disposed downwardly. Substrate 16 then is brought into contact with first plane 48 or 148 of template 46 or 146. Fluid controller 88 or 188 then reverses air flow as generally described above to push solder balls 14 out of holes 52 or 152 and thereby facilitate the placement of balls 14 onto substrate 16 in correspondence with pattern 46A.

Additional advantages and modifications will readily occur to those skilled in the art. Therefore, the invention in its broader aspects is not limited to the specific details, representative devices and methods, and illustrative examples shown and described. Accordingly, departures may be made from such details without departing from the spirit or scope of the general inventive concept as defined by the appended claims and their equivalents.

What is claimed is:

1. An apparatus for placing solder balls in a pattern on a substrate, the substrate including at least one protrusion having respectively at least one protrusion location, each of the solder balls having a solder ball diameter, the apparatus comprising:

a template having a first plane, a second plane, and a plurality of holes passing substantially orthogonally through the first and second planes so that the template is permeable to a fluid between the first and second planes, the holes corresponding in location to the pattern, each of the holes passing through the template along an axis, each of the holes having, (a) a first end adjacent to the first plane with a first cross section substantially parallel to the first plane, the first cross section having a first characteristic dimension, (b) a second end adjacent to the second plane with a second cross section substantially parallel to the second plane, the second cross section having a second characteristic dimension, and (c) a first section adjacent to the first end with a first wall and a second section adjacent to the second end with a second wall, the first section and the second section meeting at a planar intersection substantially parallel to the first and second planes, the first wall extending substantially continuously from the first end to the planar intersection, the planar intersection having a third cross section having a third characteristic dimension smaller than the first characteristic dimension and smaller than the solder ball diameter so solder balls will not pass into the second section, the second section being in fluid communication with the first section and the second end, the first characteristic dimension being 1.3 times the solder ball diameter, and the third characteristic dimension being 0.7 times the solder ball diameters, the first plane including at least one template cavity corresponding in location to the at least one protrusion location, the at least one template cavity receiving the at least one protrusion when the first plane is adjacent to the substrate.

2. An apparatus as recited in claim 1, wherein:

the first, second, and third cross sections are substantially circular in shape;

the first section is substantially conical in shape; and the axis includes an axial plane intersecting the first wall along a line, the line being substantially straight and forming a cone angle with axis, the cone angle being between about 15 and about 30 degrees.

3. An apparatus as recited in claim 1, wherein the second and the third characteristic dimensions are substantially the same size and the second section is substantially cylindrical in shape.

4. An apparatus for placing solder balls in a pattern on a substrate, the substrate including at least one protrusion having respectively at least one protrusion location, each of the solder balls having a solder ball diameter, the apparatus comprising:

a template having a first plane, a second plane, and a plurality of holes passing substantially orthogonal through the first and second planes so that the template is permeable to a fluid between the first and second planes, the holes corresponding in location to the pattern, each of the holes passing through the template along an axis, each of the holes having, (a) a first end adjacent to the first plane with a first cross section substantially parallel to the first plane, the first cross section having a first characteristic dimension, (b) a second end adjacent to the second plane with a second cross section substantially parallel to the second plane, the second cross section having a second characteristic dimension, and (c) a first section adjacent to the first end with a first wall and a second section adjacent to the second end with a second wall, the first section and the second section meeting at a planar intersection substantially parallel to the first and second planes, the first wall extending substantially continuously from the first end to the planar intersection, the planar intersection having a third cross section having a third characteristic dimension smaller than the first characteristic dimension and smaller than the solder ball diameter so solder balls will not pass into the second section, and the second section being in fluid communication with the first section and the second end, the first plane including at least one template cavity corresponding in location to the at least one protrusion location, the at least one template cavity receiving the at least one protrusion when the first plane is adjacent to the substrate.

* * * * *